United States Patent
Guillet et al.

(10) Patent No.: US 12,416,680 B2
(45) Date of Patent: Sep. 16, 2025

(54) METHOD FOR DETERMINING A PROBE SIGNAL, METHOD FOR CHECKING FOR AND DETECTING A FAULT IN AN ELECTROCHEMICAL SYSTEM EMPLOYING SUCH A SIGNAL

(71) Applicant: COMMISSARIAT A L'ENERGIE ATOMIQUE ET AUX ENERGIES ALTERNATIVES, Paris (FR)

(72) Inventors: Nicolas Guillet, Grenoble (FR); Vincent Gau, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 388 days.

(21) Appl. No.: 17/783,234

(22) PCT Filed: Dec. 7, 2020

(86) PCT No.: PCT/EP2020/084816
§ 371 (c)(1),
(2) Date: Jun. 7, 2022

(87) PCT Pub. No.: WO2021/115992
PCT Pub. Date: Jun. 17, 2021

(65) Prior Publication Data
US 2023/0014891 A1   Jan. 19, 2023

(30) Foreign Application Priority Data
Dec. 9, 2019  (FR) ..................................... 1913931

(51) Int. Cl.
*G01R 31/392*    (2019.01)
*G01R 31/382*    (2019.01)

(52) U.S. Cl.
CPC ......... *G01R 31/392* (2019.01); *G01R 31/382* (2019.01)

(58) Field of Classification Search
None
See application file for complete search history.

(56) References Cited

U.S. PATENT DOCUMENTS

| 10,436,873 B1* | 10/2019 | Morrison ............. G01R 31/367 |
| 2014/0358462 A1* | 12/2014 | Christophersen .... G01R 31/392 |
| | | 702/65 |
| 2016/0197382 A1 | 7/2016 | Sood et al. |
| 2016/0223498 A1* | 8/2016 | Steingart ............... G01N 29/46 |

(Continued)

FOREIGN PATENT DOCUMENTS

| DE | 10 2015 210266 A1 | 12/2016 |
| EP | 2 575 205 A1 | 4/2013 |

(Continued)

OTHER PUBLICATIONS

International Search Report as issued in International Patent Application No. PCT/EP2020/084816, dated Feb. 8, 2021.

(Continued)

*Primary Examiner* — John C Kuan
(74) *Attorney, Agent, or Firm* — Pillsbury Winthrop Shaw Pittman LLP (57) ABSTRACT

A method for determining a probe signal for acoustically interrogating an electrochemical system, the method including transmitting a first signal, called the calibration signal, including a wave train of multiple frequencies, the spectral density associated with each frequency being identical; receiving the response of the electrochemical system to the calibration signal; determining, on the basis of the received response and for each frequency of the calibration signal, a signal attenuation factor; determining, for each attenuation factor, a correction factor according to the attenuation factor so as to associate a correction factor with each frequency of the calibration signal; and determining the probe signal, the (Continued)

probe signal being obtained by multiplying the spectral density associated with each frequency of the calibration signal by the correction factor corresponding to the frequency in question.

12 Claims, 8 Drawing Sheets

(56) References Cited

U.S. PATENT DOCUMENTS

| | | |
|---|---|---|
| 2018/0164383 A1* | 6/2018 | Hsieh .................. H01M 10/486 |
| 2019/0049518 A1 | 2/2019 | Shen et al. |
| 2020/0300920 A1* | 9/2020 | Christophersen .. G01R 31/3648 |

FOREIGN PATENT DOCUMENTS

| | | |
|---|---|---|
| JP | 2005-291832 A | 10/2005 |
| JP | 2006-017640 A | 1/2006 |
| JP | 2018-537682 A | 12/2018 |
| WO | WO-9613702 A1 * | 5/1996 ............. G01H 15/00 |
| WO | WO 2019/206867 A1 | 10/2019 |

OTHER PUBLICATIONS

Gold, L., et al., "Probing lithium-ion batteries' state-of-charge using ultrasonic transmission e Concept and laboratory testing," Journal of Power Sources 343, (2017), pp. 536-544.

Notice of Reasons for Refusal as issued in Japanese Patent Application No. 2022-534696, dated Nov. 12, 2024.

* cited by examiner

METHOD FOR DETERMINING A PROBE SIGNAL, METHOD FOR CHECKING FOR AND DETECTING A FAULT IN AN ELECTROCHEMICAL SYSTEM EMPLOYING SUCH A SIGNAL

CROSS-REFERENCE TO RELATED APPLICATIONS

This application is the U.S. National Stage of PCT/EP2020/084816, filed Dec. 7, 2020, which in turn claims priority to European patent application number 1913931 filed Dec. 9, 2019. The content of these applications are incorporated herein by reference in their entirety.

TECHNICAL FIELD OF THE INVENTION

The technical field of the invention is that of non-intrusive diagnostic and the operation of electrochemical systems for converting energy (cells, batteries, fuel cells, etc.).

The present invention relates to the determination of a probe signal and the use of this signal in monitoring and detecting faults of an electrochemical system. The present invention also relates to a device configured to implement such a detection.

TECHNOLOGICAL BACKGROUND OF THE INVENTION

Systems for monitoring and managing batteries are indispensable in order to meet demands from users the most effectively as possible. Generally, the monitoring and management systems take account of the stage of charge of the battery, the state of health of the battery and/or the state of safety of the battery (detection of an abnormal operation). This various information is generally obtained by measuring electrical magnitudes at the terminals of the battery, but also by external data such as that provided by thermal analysis techniques (measurement of temperature and/or of heat flux) or non-destructive controls (acoustic characterisation for example). From the information obtained through the measurements, the management system regulates the operation of the battery in order to optimise the performance thereof and guarantee the safety of the assembly.

The techniques for monitoring batteries in operation via ultrasound acoustic signals that are currently proposed (Gold et al., 2017; Sood, Pecht, & Osterman, 2016; Steingart et al., 2016, DE102015210266A1) however have certain disadvantages. First of all, they take interest only in certain operating indicators of the battery independent of one another (state of charge, state of health, temperature, detection of faults) and do not take into consideration all the information contained in the acoustic signal measured.

Then, the specific parameters of the incident acoustic signals used are often chosen more or less arbitrarily and do not take account of the particularities of each battery. This results in a loss of relevant information for the optimal management of the batteries and also does not make it possible to take account of the change in the characteristics of the battery over its service life.

Finally, most of the works use incident signals in the form of pulses of short duration (from a few tens of ns to several ms) which do not allow for the establishing of a stationary regime within the battery, thus limiting the capacity of the mathematic tools used to analyse the signals.

The choice of the frequency of the incident signal is very important. It depends substantially on the experimental assembly used (properties of the transducers used for the transmission of the incident signal and the receiving of the transmitted signal, geometric particularities of the battery tested, nature of the materials that it is comprised of, etc.) on the expected information (measurement of flight time, frequency or time analysis of the signal transmitted) and on the structural properties of the materials of which it is desired to monitor the change (thin layers of electrodes, dense or porous materials, etc.).

There is therefore a need for an effective method that makes it possible to determine the optimum parameters of the incident acoustic signal (frequency, duration, amplitude) to detect the variations and changes of the signal transmitted with the greatest precision.

SUMMARY OF THE INVENTION

The invention offers a solution to the problems mentioned hereinabove, by making it possible to determine the characteristics of a probe signal specific to the electrochemical system that is acoustically tested. In addition, the adaptability of the probe signal makes it possible to take account of different operating conditions and to take account of the change in the electrochemical system over the course of its life as well as the detection of any anomaly in the operation of the electrochemical system.

For this, a first aspect of the invention relates to a method for determining a probe signal for acoustically interrogating an electrochemical system, said method being characterised in that it comprises:
  a step of transmitting a first signal, called the calibration signal, comprising a wave train of multiple frequencies, the spectral density associated with each frequency being identical;
  a step of receiving the response of the electrochemical system to the calibration signal;
  a step of determining, on the basis of the received response and for each frequency of the calibration signal, a signal attenuation factor;
  a step of determining, for each attenuation factor, a correction factor according to said attenuation factor so as to associate a correction factor with each frequency of the calibration signal;
  a step of determining the probe signal, said probe signal being obtained by multiplying the spectral density associated with each frequency of the calibration signal by the correction factor corresponding to the frequency in question.

Thanks to the invention, the probe signal determined takes into consideration the specificities of the electrochemical system to be interrogated. In addition, the response of the system to the probe signal includes a characteristic spectral density of which it becomes easy to observe the changes, which greatly improves the detection of the ageing of the electrochemical system or any faults of the latter.

In addition to the characteristics that have just been mentioned in the preceding paragraph, the method according to a first aspect of the invention can have one or more additional characteristics among the following, taken individually or according to any technically permissible combination.

Advantageously, the spectral density (and therefore the amplitude) associated with each frequency in the calibration signal is chosen in such a way as to induce a linear response of the electrochemical system.

Advantageously, the duration of the calibration signal is long enough to establish a stationary regime in the response of the electrochemical system.

Advantageously, the frequencies associated with a factor of an attenuation greater than a predetermined threshold are not taken into account in the determining of the probe signal.

Advantageously, during the step of transmitting a first signal, the calibration signal is transmitted while the electrochemical system is in a reference state.

A second aspect of the invention relates to a method for checking the conformity of an electrochemical system to be checked with respect to a reference electrochemical system characterised in that it comprises:
- a step of determining a probe signal using a method according to a first aspect of the invention implemented on a reference electrochemical system;

for each calibration electrochemical system of a plurality of calibration electrochemical systems:
- a step of transmitting the probe signal determined hereinabove;
- a step of receiving the response of the calibration electrochemical system to said probe signal;

a statistic of the responses of the calibration systems being thus obtained; the method also comprising:
- a step of transmitting the probe signal in an electrochemical system to be checked;
- a step of receiving the response of the electrochemical system to be checked to said probe signal;
- a step of comparing the response of the electrochemical system to be checked with the statistic of responses of the calibration electrochemical systems in such a way as to detect a fault of the electrochemical system to be checked.

A third aspect of the invention relates to a method for detecting a fault of an electrochemical system, said method being characterised in that it comprises:—
- a step of determining a probe signal using a method according to a first aspect of the invention;
- a step of transmitting the probe signal determined hereinabove;
- a step of receiving the response of the electrochemical system to said probe signal;
- a step of analysing the response in such a way as to detect a fault of the electrochemical system.

Preferably, the steps of transmitting a probe signal, of receiving the response of the electrochemical system and of analysing the response are repeated at regular time intervals or at variable time intervals.

In addition to the characteristics that have just been mentioned in the preceding paragraph, the method according to a third aspect of the invention can have one or more additional characteristics among the following, taken individually or according to any technically permissible combination.

Advantageously, during the step of determining a probe signal, the probe signal is determined while the electrochemical system is in a reference state.

Advantageously, the steps of transmitting a probe signal, of receiving the response of the electrochemical system and of analysing the response are implemented each time that the electrochemical system is in the reference state used for determining the probe signal during the step of determining a probe signal.

Advantageously, the step of analysing the response comprises:
- a sub-step of determining the spectral density of the response to the probe signal;
- a sub-step of memorising the spectral density of the response to the probe signal;
- a sub-step of comparing the determined spectral density with a statistic of the responses, said statistic of responses being determined from spectral densities memorised during preceding implementations of the step of memorising the spectral density of the response to the probe signal;
- a sub-step of detecting a fault of the electrochemical system when the difference between the spectral density determined during the sub-step of determining and the statistic of the responses is greater than a predetermined value.

Advantageously, the probe signal is determined again at a regular interval or on demand of a user.

Advantageously, when the speed of the variation of the response moves away beyond a predefined threshold, a malfunction of the electrochemical system is detected during the step of analysing the response. The variation speed of the response is defined as the difference between the last two responses measured divided by the time separating these two measurements.

Advantageously, the method according to a third aspect of the invention comprises, when a fault is detected, a step of sending a signal to the management system in charge of the electrochemical system.

Advantageously, the method according to a third aspect of the invention comprises, after the step of analysing the response in such a way as to detect a fault of the electrochemical system:
- a step of determining a new probe signal using a method according to a first aspect of the invention, with the correction factors being memorised;
- a step of analysing the change in the correction factors in such a way as to detect a possible fault.

A fourth aspect of the invention relates to a device comprising means configured to implement a method according to a first, a second or a third aspect of the invention.

A fifth aspect of the invention relates to a computer program comprising instructions that, when the program is executed by a computer, lead the latter to implement the method according to the first, the second or the third aspect of the invention.

A sixth aspect of the invention relates to a computer-readable storage medium on which is recorded the computer program according to a fifth aspect of the invention.

The invention and its different applications shall be better understood when reading the following description and examining the accompanying figures.

BRIEF DESCRIPTION OF THE FIGURES

The figures are presented for the purposes of information and in no way limit the invention.

DETAILED DESCRIPTION

The figures are presented for the purposes of information and in no way limit the invention. In what follows, the term "spectral density of a signal" will refer to the power spectral density of the signal. Likewise, the term "frequency" in terms of the invention corresponds to a frequency width centred on the frequency in question and of which the value is fixed by the parameters of the measurement, and more particularly the ratio between the bandwidth of the measurement and the sampling of the frequencies chosen.

Determination of a Probe Signal

Figure 1:
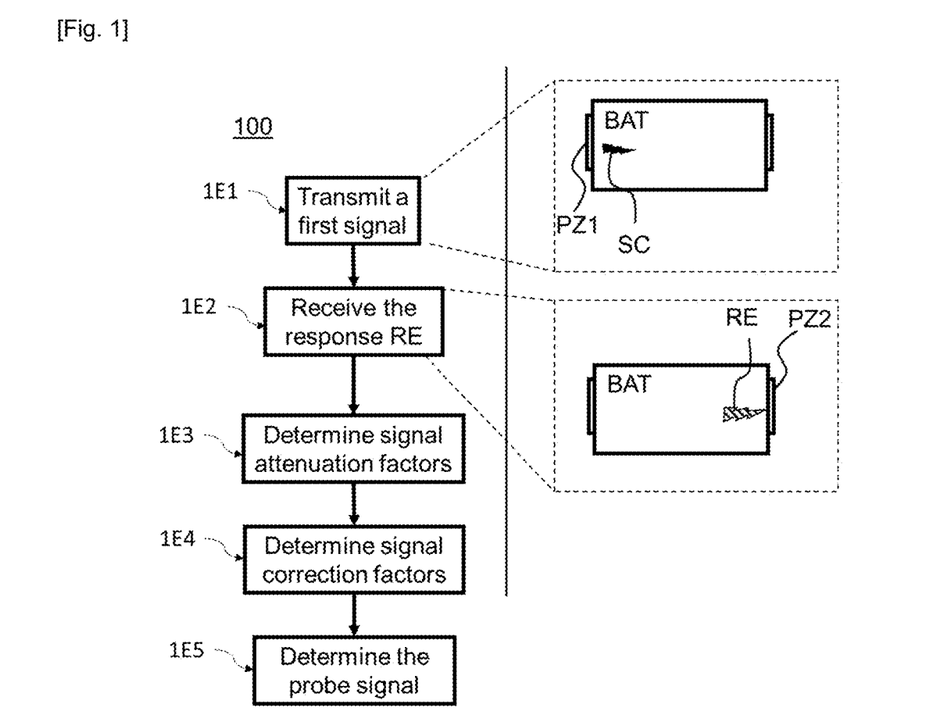
FIG. 1 shows a flowchart of a method according to a first aspect of the invention.

A first aspect of the invention shown in FIG. 1 relates to a method 100 for determining a probe signal SS for acoustically interrogating an electrochemical system BAT. As shall be detailed in what follows, the method 100 according to a first aspect of the invention makes it possible to determine a probe signal SS constructed to generate a specific response RE (or expected response RE) of the assembly comprising the electrochemical system BAT in question and the transducer generating the signal. It also makes it possible to obtain a probe signal SS able to change over the course of time to monitor the change in the electrochemical system BAT. In what follows, for reasons of concision, reference will be made to the response RE of the electrochemical system BAT to designate the specific response RE (or expected response RE) of the assembly comprising the electrochemical system BAT in question and the transducer generating the probe signal SS.

For this, the method 100 according to a first aspect of the invention comprises a step 1E1 of transmitting a first signal, called the calibration signal SC, comprising a wave train of multiple frequencies, the spectral density associated with each frequency preferably being identical. In an embodiment, the calibration signal SC is generated by means of a piezoelectric transducer PZ1 fixed on the electrochemical system BAT. In an embodiment, the duration of the calibration signal SC is sufficiently long to establish a stationary regime in the response of the electrochemical system BAT.

In an embodiment, the spectral density (and therefore the amplitude) of the calibration signal SC is chosen in such a way as to guarantee the linearity in the response RE of the electrochemical system BAT. In order to check this condition, calibration signals SC can be sent successively with different amplitudes, for example by adjusting the voltage of the signal sent to a piezoelectric transducer PZ1. For all of the measurements, the energy of the signal transmitted (i.e. of the response RE of the electrochemical system BAT) has to be proportional to the energy of the calibration signal SC transmitted.

In an embodiment, the calibration signal SC is defined by the frequency range that will be considered (minimum and maximum frequency), the sampling frequency (what are the precise frequencies that the incident will be composed of), the spectral density associated with each frequency as well as the number of successive periods required at each frequency to reach a stationary regime.

The method 100 according to a first aspect of the invention then comprises a step 1E2 of receiving the response RE of the electrochemical system BAT to the calibration signal SC. The receiving can be done by means of a transducer PZ2 (e.g. a piezoelectric transducer) fixed to the electrochemical system BAT.

Figure 2:
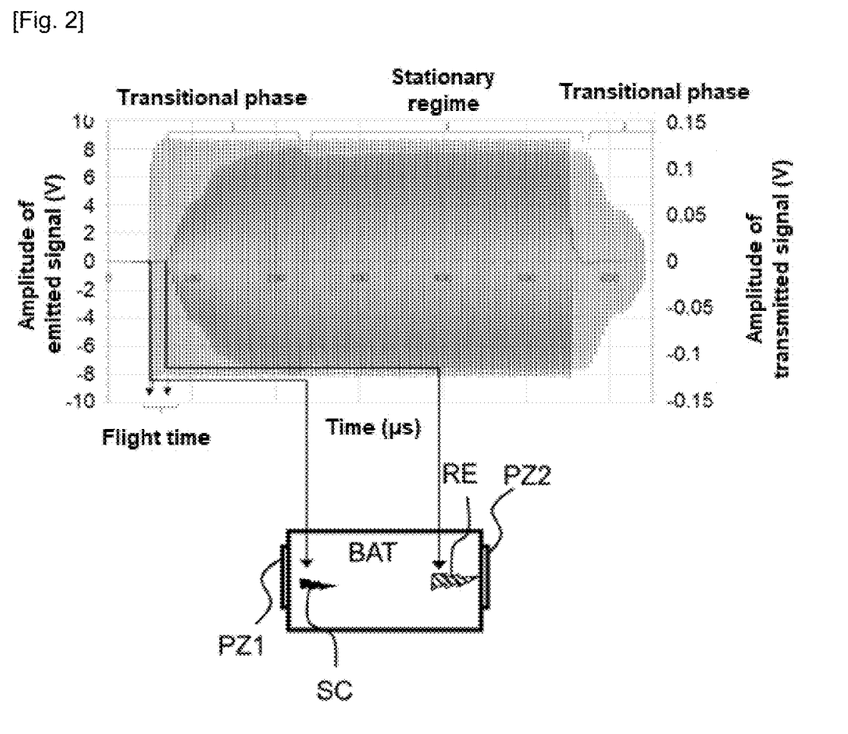
FIG. 2 shows a graph illustrating a calibration signal and the response of an electrochemical system to this signal.

The signals measured during the steps 1E1, 1E2 of transmitting and of receiving are shown in FIG. 2 on which the calibration signal SC is shown as well as the response RE of the electrochemical system BAT. It is possible to identify in this figure the two relative transitional regimes at the beginning and at the end of the calibration signal SC as well as the stationary regime in the response of the electrochemical system BAT. Obtaining a stationary regime in the response RE of the electrochemical system BAT is preferable for determining the probe signal SS, and the calculations required to obtain the probe signal SS described in what follows are therefore preferably used from data acquired during the stationary regime.

Figure 3:
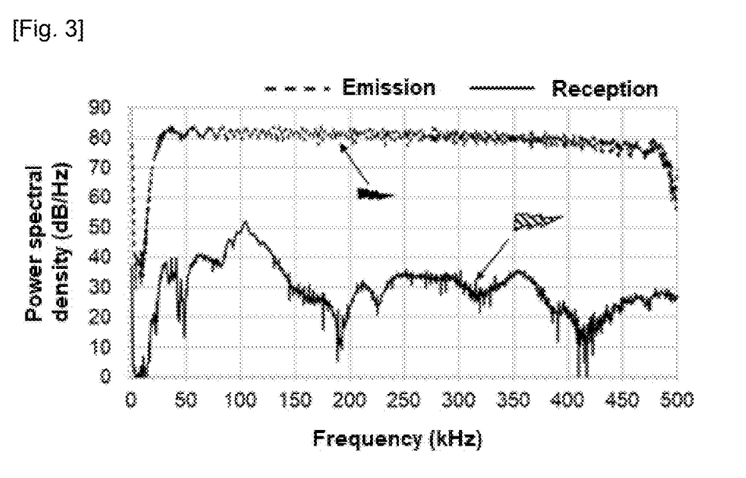
FIG. 3 shows a graph illustrating the spectral density of a calibration signal and the spectral density of the response of a system to such a signal.

As shown in FIG. 3, it is possible to analyse the steps 1E1,1E2 of transmitting and of receiving from a frequency standpoint taking interest in the spectral density of the calibration signal SC ("transmission") and of the response of the electrochemical system BAT ("reception") according to the frequency. In the example shown in FIG. 3, the spectral density of the received signal (i.e. of the response RE of the electrochemical system BAT) varies substantially over the frequency range measured, while the spectral density of the calibration signal SC is constant over a large portion of the frequency band in question.

The frequency band in question is in general chosen from prior measurements on identical systems BAT and/or according to the nature and characteristics of the transducers PZ1, PZ2 used to generate the calibration signal SC (or the probe signal SS) and/or to measure the response RE of the electrochemical system BAT.

Figure 4:
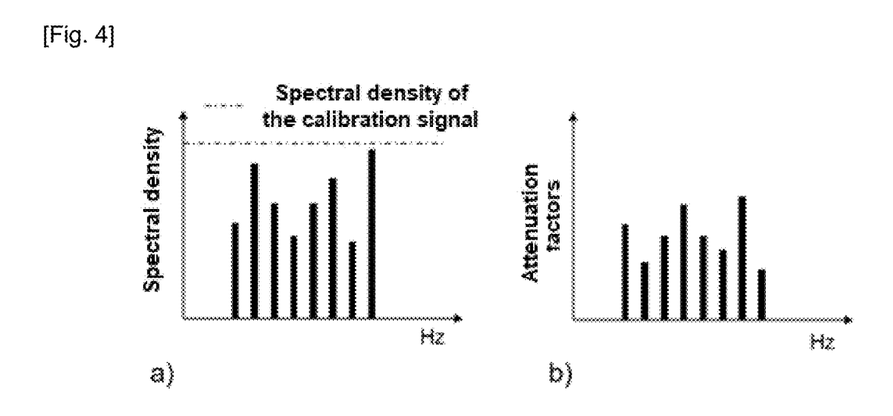
FIG. 4a and FIG. 4b show the spectral density of a response as well as the associated attenuation factors.

From this information, it is possible to take interest in attenuating the signal received, i.e. of the response RE of the electrochemical system BAT, by comparison with the signal transmitted, i.e. the calibration signal SC. For this, the method according to the invention also comprises a step 1E3 of determining, on the basis of the received response RE and for each frequency of the calibration signal SC, a signal attenuation factor. The attenuation for a given frequency can be defined as the spectral density of the signal received (i.e. of the response RE of the system) at the given frequency divided by the spectral density of the signal transmitted (i.e. of the calibration signal SC) at the given frequency. The greater the attenuation is, the less the spectral density of the response RE of the electrochemical system BAT is higher for a given spectral density of the calibration signal SC at the same frequency. This step is shown in FIG. 4a and FIG. 4b. FIG. 4a diagrammatically shows the spectral density of the response RE of the electrochemical system BAT to the calibration signal SC. As the dotted line shows in this figure, the calibration signal SC is characterised by a spectral density that is substantially constant over the frequency band in question. FIG. 4b diagrammatically shows the attenuation factor associated with each frequency: the more the spectral density of a frequency in question moves away from the dotted line, the higher its attenuation factor is.

Figure 5:
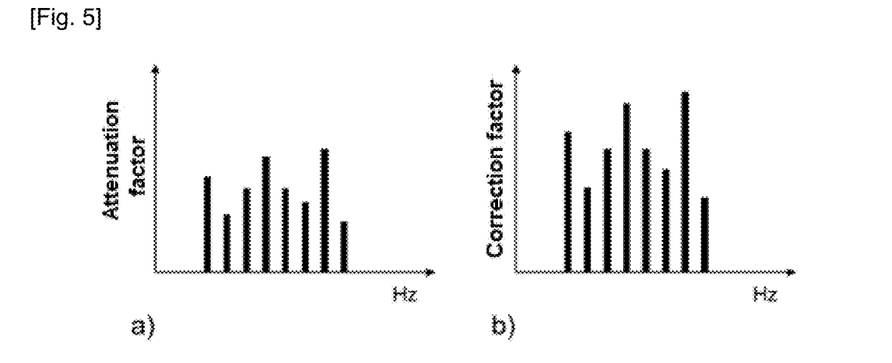
FIG. 5a and FIG. 5b show the attenuation factors of a response as well as the associated correction factors.

It is then possible, from these attenuation factors, to determine correction factors that will then be applied to the calibration signal SC in order to obtain the probe signal SS. For this, the method 100 according to a first aspect of the invention comprises a step 1E4 of determining, for each attenuation factor, a correction factor according to said attenuation factor so as to associate a correction factor with each frequency of the calibration signal SC. This step is shown in FIG. 5a and FIG. 5b. As can be seen in these two figures, a high attenuation factor (relatively to the others) will be associated with a high correction factor (relatively to the others). This relationship is understood in that the correction factor seeks to offset the effects of the attenuation.

Figure 6:
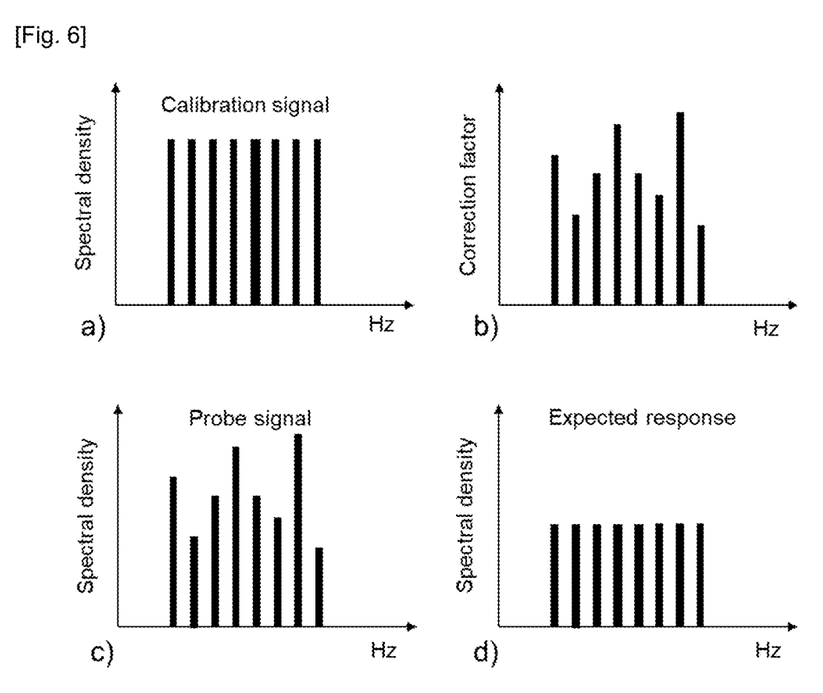
FIG. 6a to FIG. 6d show in the form of graphs the calculation principle of a probe signal using a method according to a first aspect of the invention.

As mentioned hereinabove, the correction factors are then used to determine the probe signal SS from the calibration signal SC that made it possible to determine these correction factors. For this, the method according to a first aspect of the invention comprises a step 1E5 of determining the probe signal SS, said probe signal SS being obtained by multiplying the spectral density associated with each frequency of the calibration signal SC by the correction factor corresponding to the frequency in question. FIG. 6 diagrammatically shows in FIG. 6a a representation of the spectral density of a calibration signal SC and in FIG. 6b the correction factors determined in the preceding step making it possible to obtain a response RE such as shown in FIG. 6d, i.e. a response RE having a spectral density of substantially constant power. The spectral density of the probe signal SS shown in FIG. 6c making it possible to obtain this response RE is obtained by multiplying the spectral density of the calibration signal SC associated with each frequency by the corresponding correction factor.

In an embodiment, the correction factor associated with each frequency (as shown in FIG. 6b already introduced) is chosen in such a way that the spectral density associated with each frequency in the response RE of the electrochemical system BAT at the transmission of the probe signal SS is substantially identical for each frequency (as shown in FIG. 6d already introduced). Having a response RE to the probe signal SS of which the spectral density is substantially constant over the entire frequency range makes it possible to very easily identify and with great precision the variations observed during the operation of the electrochemical system BAT. It is then possible to quantify the variation in the energy of the signal transmitted with respect to the reference value and to identify the frequencies for which the relative variations are the most substantial. This facility of comparison is further increased when the probe signal SS is obtained for a reference state and the comparison is made between two measures carried out for this same reference state. In an alternative embodiment, the correction factor associated with each frequency is chosen in such a way that the spectral density associated with each frequency in the response RE of the electrochemical system BAT to the transmission of the probe signal SS is increasing or decreasing with the frequency. In an alternative embodiment, the correction factor associated with each frequency is chosen in such a way that the spectral density associated with each frequency in the response RE of the electrochemical system BAT to the transmission of the probe signal SS is a parabolic function of the frequency.

In an embodiment, the frequencies associated with an attenuation factor greater than a predetermined threshold are not taken into account. For example, only the frequencies of the response RE of the electrochemical system BAT having a power spectral density greater than 30 dB/Hz are retained.

It can be advantageous to determine the probe signal SS for a well-defined state of the electrochemical system BAT, referred to as reference state. As shall be seen in what follows, such a reference state can have advantages in the monitoring of the change over time of the electrochemical system BAT. For this, in an embodiment, during the step 1E1 of transmitting a first signal, the calibration signal SC is transmitted while the electrochemical system BAT is in a reference state. For example, when the electrochemical system BAT is a battery, the reference state can correspond to a given state of charge. In an embodiment, this reference state can be associated with several operating conditions of the electrochemical system BAT. For example, when the electrochemical system BAT is a battery, the reference state can correspond to a given state of charge and to a given temperature of the battery, or to a given state of charge, to a given temperature of the battery and to a given supplied current.

Quality Control of an Electrochemical System

From a probe signal SS determined using a method 100 according to a first aspect of the invention, it is then possible to characterise the state of an electrochemical system BAT. A first application possible is the quality control of an electrochemical system BAT on a production line. This production line produces electrochemical systems BAT that are then suitable to test at the output of the production chain. For this, each electrochemical system BAT at the output of production is compared with a statistic of the responses RE established over a plurality of calibration electrochemical systems BAT, this statistic being obtained using a probe signal SS determined from a reference electrochemical system BAT corresponding to the desired product. This comparison, or quality control, can therefore be done by taking advantage of the probe signal SS such as determined by a method 100 according to a first aspect of the invention.

Figure 7:
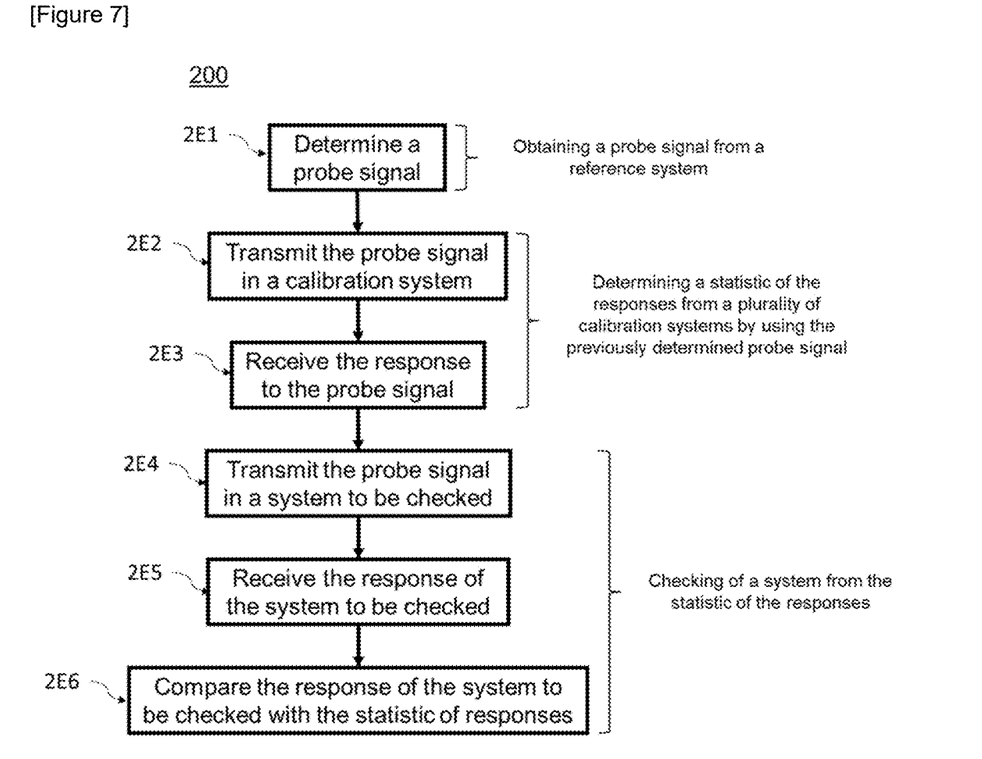
FIG. 7 shows a flowchart of a method according to a second aspect of the invention.

For this, a second aspect of the invention shown in FIG. 7 relates to a method 200 for checking the conformity of an electrochemical system BAT to be checked with respect to a reference electrochemical system BAT.

The method 200 according to a second aspect of the invention comprises a step 2E1 of determining a probe signal SS using a method 100 according to a first aspect of the invention, said method 100 being implemented on a reference electrochemical system BAT. This step makes it possible to obtain a probe signal SS corresponding to the target quality on the production line.

Once the probe signal SS is determined, it is necessary to establish a statistic of the responses RE to this probe signal SS. For this, the method 200 according to a second aspect of the invention comprises, for each calibration electrochemical system BAT of a plurality of calibration electrochemical systems BAT, a step 2E2 of transmitting the probe signal SS determined hereinabove; and a step 2E3 of receiving the response RE of the calibration electrochemical system BAT to said probe signal SS. Thus, a statistic of responses RE to the probe signal SS is constituted, this statistic able to then be used to check the electrochemical systems BAT exiting the production chain.

For this purpose, the method 200 according to a second aspect of the invention comprises a step 2E4 of transmitting the probe signal SS in an electrochemical system BAT to be checked; a step 2E5 of receiving the response RE of the electrochemical system BAT to be checked to said probe signal SS; and a step 2E6 of comparing the response RE of the electrochemical system BAT to be checked with the statistic of the responses of the calibration electrochemical systems BAT in such a way as to detect any fault of the electrochemical system BAT to be checked.

In an embodiment, the electrochemical systems BAT involved in the method 200 according to a second aspect of the invention are in the same reference state when the probe signal SS is determined or when they are subjected to the probe signal SS thus determined.

Monitoring of an Electrochemical System BAT During the Operation Thereof

The probe signal SS determined with a method 100 according to a first aspect of the invention can also be used to carry out a monitoring of an electrochemical system BAT during the operation thereof. For this, a third aspect of the invention shown in FIG. 8 relates to a method 300 for detecting a fault of an electrochemical system BAT.

Figure 8:
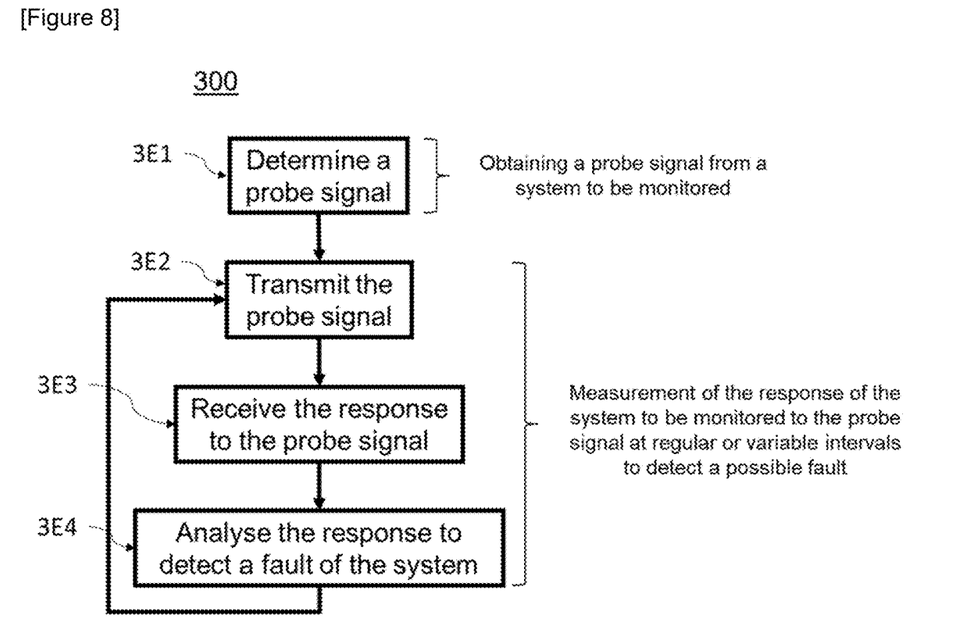
FIG. 8 shows a flowchart of a method according to a third aspect of the invention.

The method 300 according to a third aspect of the invention comprises a step 3E1 of determining a probe signal SS using a method 100 according to a first aspect of the invention. In other words, a method 100 according to a first aspect of the invention is implemented on the electrochemical system BAT of which it is desired to provide monitoring.

The method 300 according to a third aspect of the invention then comprises a step 3E2 of transmitting the probe signal SS in such a way as to obtain an acoustic response of the electrochemical system BAT.

The method 300 according to a third aspect of the invention then comprises a step 3E3 of receiving the response of the electrochemical system BAT to said probe signal SS. It is interesting to note here that the expected response is known since a probe signal SS was obtained using a method 100 according to a first aspect of the invention. It therefore becomes very simple to check that the response obtained during this step is compliant with the expected response.

For this, the method according to a third aspect of the invention then comprises a step 3E4 of analysing the response in such a way as to detect a possible fault of the electrochemical system.

Preferably, so as to ensure a monitoring during the operation of the electrochemical system BAT, the steps 3E2, 3E3, 3E4 of transmitting a probe signal SS, of receiving the response of the electrochemical system BAT and of analysing the response are repeated at regular time intervals or at variable time intervals.

In an embodiment, the time interval between two implementations of these steps is variable, the time step associated with an electrochemical system BAT used (substantial current, high temperature, etc.) being smaller than the step of time associated with an electrochemical system BAT that is not used (zero current, etc.).

Figure 9:
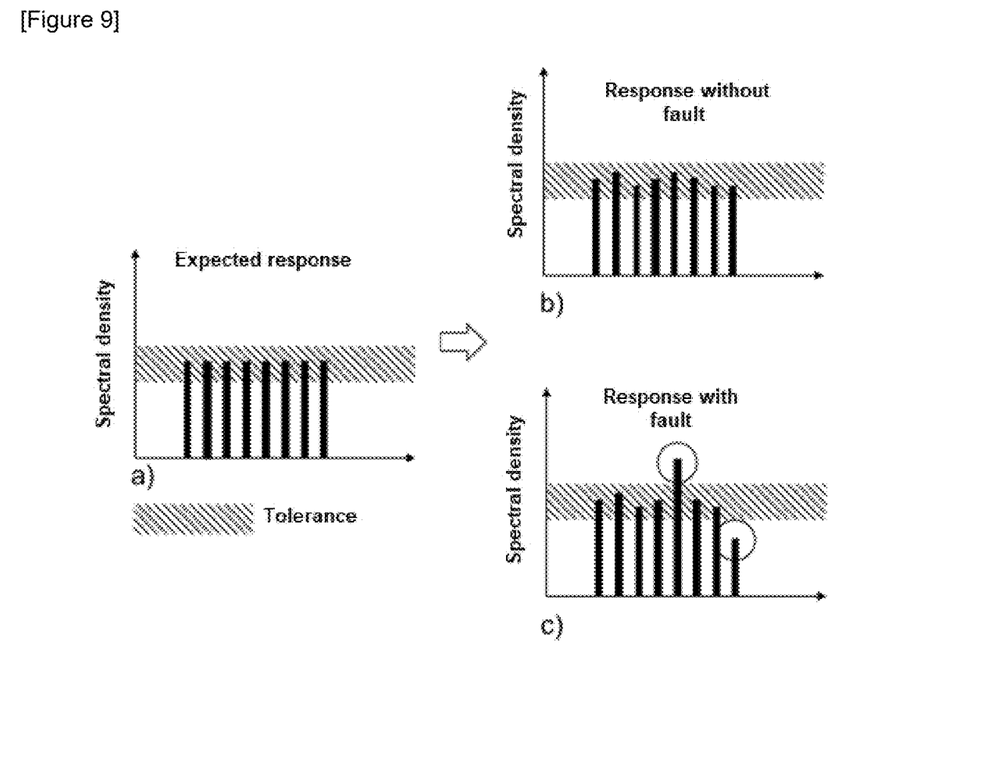
FIG. 9a to FIG. 9c show an example of detecting a defect in a method according to a third aspect of the invention.

As shall be detailed in what follows, the analysis of the response RE of the electrochemical system BAT to the probe signal SS can be carried out in several ways. It can for example consist of a comparison, frequency by frequency, of the expected response and of the response measured during the step 3E3 of receiving the response of the electrochemical system BAT. Such an example of detecting a defect from a measurement of the response RE of the system is shown in FIG. 9. FIG. 9a shows the expected response RE to the probe signal SS as well as a tolerance that defines the difference in relation to the expected response RE which can be considered as normal. FIG. 9b shows a response RE corresponding to a state without a fault and FIG. 9c shows a response RE corresponding to a state with a fault, the portions of the response RE triggering the defect being circled with black. FIG. 9 thus shows how using a probe signal SS associated with an expected response RE of the electrochemical system BAT facilitates determining a tolerance.

Alternatively or additionally, this analyse can include the calculation of a convolution between the spectral density of the expected response RE and the spectral density of the obtained response RE. Plus generally, any method for comparing two signals can be implemented, a difference that is too substantial between the expected response RE and the obtained response RE bearing witness to a fault within the electrochemical system BAT. As shall be shown in what follows, the comparison can also be made from a statistic of the responses to the probe signal SS of the electrochemical system BAT.

It can be advantageous to implement the method 300 according to a third aspect of the invention using a determined probe signal SS for a reference state of the electrochemical system BAT of which it is desired to ensure monitoring. Indeed, as has already been detailed, using a reference state has certain advantages in terms of facility in detecting a possible fault. For this, in an embodiment, during the step 3E1 of determining a probe signal SS, the probe signal SS is determined while the electrochemical system BAT is in a reference state. Preferably, this reference state is defined with respect to the application which is made of the electrochemical system BAT and/or the mission profile of the electrochemical system BAT. It can for example be chosen in the maximum charge state, zero current and a defined temperature range but also in a partial charge state, a current and a defined temperature range.

It is useful to note that choosing a reference state for the determining of the probe signal SS does not impose carrying out the steps 3E2, 3E3, 3E4 of transmitting a probe signal SS, of receiving the response of the electrochemical system BAT and of analysing the response when the electrochemical system BAT is in this reference state. These steps can on the contrary also be implemented during the operation, between two instants where the electrochemical system BAT is in this reference state. During such an implementation, the variations in energy transmitted by the probe signal SS and the variations of the power spectral density observed in the response RE of the electrochemical system BAT in relation to the expected response RE change in a reversible manner and follow, except for a malfunction, a similar change at each cycle to approach the reference value when the electrochemical system BAT again approaches the reference state (if ageing is excluded which induces a slight deviation as shall be shown in what follows). Using a reference state therefore makes it possible to check that this reversible change of the response to the probe signal SS occurs.

From the same alternative, it is possible to check the state of the electrochemical system BAT only when the latter is in the reference state. Of course, the change described hereinabove can no longer be observed, but this embodiment can be adapted to situations where it is desired to reduce the number of implementations of the steps 3E2, 3E3, 3E4 of transmitting a probe signal SS, of receiving the response of the electrochemical system BAT and of analysing the response or in situations where the change in the response outside the reference state is of little interest. For this, in an embodiment, the steps 3E2, 3E3, 3E4 of transmitting a probe signal SS, of receiving the response of the electrochemical system BAT and of analysing the response are implemented each time that the electrochemical system BAT is in the reference state used for determining the probe signal SS. Comparing the measured response in relation to the expected response is facilitated, the electrochemical system BAT being in a reference state at each step of measuring the response RE.

Figure 10:
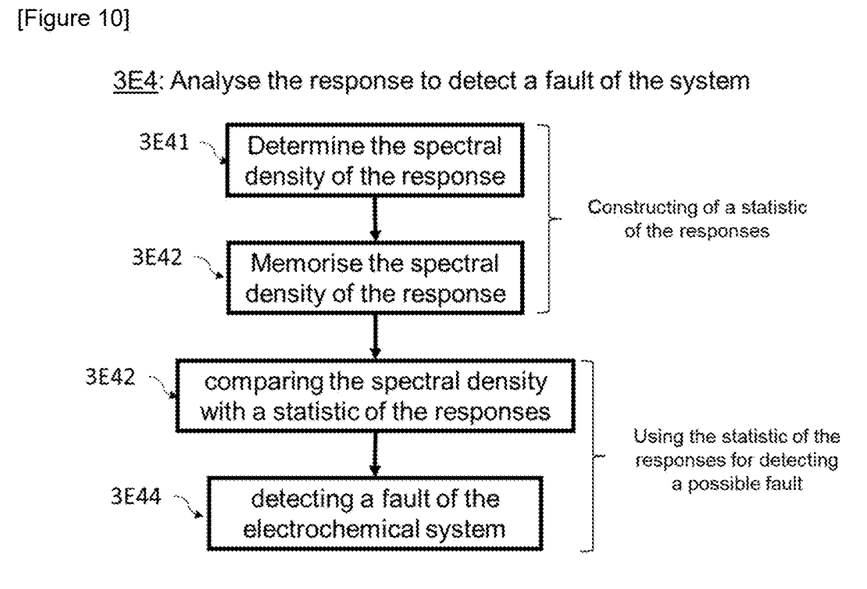
FIG. 10 shows a flowchart of a particular embodiment of a method according to a third aspect of the invention.

As mentioned hereinabove, it can be interesting to proceed with a statistical analysis of the response RE of the electrochemical system BAT to the probe signal SS. This approach in particular makes it possible to automate the determining of the threshold or thresholds or of the tolerance corresponding to a malfunction of the electrochemical system BAT. It also makes it possible to automate the updating of these thresholds by adding measurements that supply the statistic of the responses RE during operation of the electrochemical system BAT. For this, in an embodiment shown in FIG. 10, the step 3E4 of analysing the response comprises:

- a sub-step 3E41 of determining the spectral density of the response RE to the probe signal SS;
- a sub-step 3E42 of memorising the spectral density of the response RE to the probe signal SS;
- a sub-step 3E43 of comparing the determined spectral density with a statistic of the responses RE, said statistic being determined from spectral densities memorised during preceding implementations of the step 3E42 of memorising the spectral density of the response RE to the probe signal SS;
- a sub-step 3E44 of detecting a fault of the electrochemical system BAT when the difference between the spectral density determined during the sub-step 3E41 of determining and the statistic of the responses is greater than a redetermined value.

In an embodiment, a fault of the electrochemical system BAT is detected during the sub-step 3E44 of detecting a fault of the electrochemical system when the spectral density of the response RE moves away by more than $3\sigma$ in relation to the statistic of the responses for at least one frequency.

In an alternative embodiment, a fault of the electrochemical system BAT is detected during the sub-step 3E44 of detecting a fault of the electrochemical system when the spectral density of the response RE moves away by more than $3\sigma$ in relation to the statistic of the responses for a plurality of frequencies, the number of frequencies constituting the plurality of frequencies being chosen according to the desired sensitivity. It can be useful to note that this statistic method can also be used in the framework of the method 200 for checking the conformity of an electrochemical system BAT according to a second aspect of the invention, the statistic used then being the one obtained from the plurality of calibration electrochemical systems BAT.

The variations in the responses RE over time make it possible to determine if the materials that the electrochemical system BAT is comprised of undergo reversible variations (repeatable changed from one charge-discharge cycle to another, influence of the temperature) comprised within the predefined limits or a slow and continuous deviation (ageing of the battery and instrumentation assembly), and even a sudden variation, exceeding the predefined limits, which would be the sign of a malfunction. It can therefore be interesting to take interest in these variations.

For this, in an embodiment, the speed of the variation of the response RE of the electrochemical system BAT to the probe signal SS is also taken into account. More particularly, when the speed of the variation of the response (defined as the difference between the last two measured responses RE divided by the time that separates these two measurements) move away beyond a predefined threshold, a malfunction of the electrochemical system BAT is detected during the step 3E4 of analysing the response. The predefined threshold can be fixed according to the speeds of the variation considered as normal and/or a statistic of the speeds of the variation constituted at the same time as the statistic of the responses. Preferably, the verification of this variation will be done by frequency. In other words, the variation of the spectral density will be evaluated for each frequency in such a way as to obtain as many variation values as frequencies considered. In this case, a malfunction can be observed if at least one frequency is associated with a variation greater than a predetermined threshold or when a predefined number of frequencies are associated with a variation greater than a predefined threshold. In the second case, the number of frequencies considered can depend on the desired sensitivity in the detecting of a malfunction. The threshold can vary according to the frequency considered or be identical for all frequencies.

In an embodiment, when a fault is detected, the method according to a third aspect of the invention comprises a step of sending a signal to the management system in charge of the electrochemical system in such a way that the latter can apply corrective measures.

Monitoring the Aging of the Electrochemical System

It can be interesting to use the probe signal SS not only for identifying a fault, but also to monitor the ageing of an electrochemical system BAT. Indeed, if the probe signal SS is determined for the same system BAT for a given reference state and for two instants separated in time, the correction factors associated with the probe signal SS determined at the first instant will be different from the correction factors associated with the probe signal SS determined at the second instant for a given expected response RE. This change in the correction factors shows a change in the electrochemical system BAT over time, generally induced by ageing.

Figure 11:
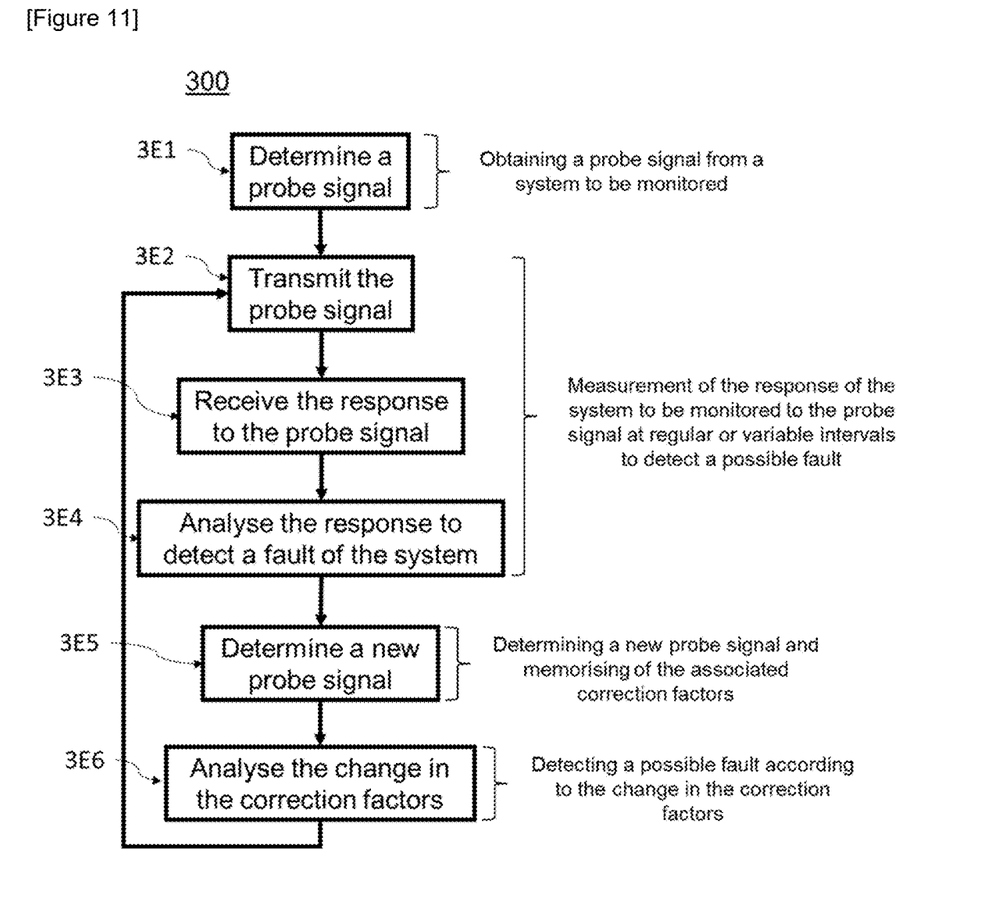
FIG. 11 shows a flowchart of a particular embodiment of a method according to a third aspect of the invention.

In order to take advantage of this, in an embodiment shown in FIG. 11, the method 300 according to a third aspect of the invention comprises, after the step 3E4 of analysing the response in such a way as to detect a fault of the electrochemical system, a step 3E5 of determining a new probe signal SS using a method 100 according to a first aspect of the invention, the correction factors being memorised. In addition, in this embodiment, the method 300 according to a third aspect of the invention also comprises a step 3E6 of analysing the change in the correction factors in such a way as to detect a possible fault. In an embodiment, the step 3E5 of determining a new probe signal SS is implemented only when the electrochemical system BAT is in the reference state. In an embodiment, an indicator of ageing of the electrochemical system (and/or of the means for generating and/or acquiring signals) is determined from the change in the correction factors.

More generally, the change in the correction factors can be used to characterise a large number of phenomena. It is for example possible to take interest in the speed of the change of these correction factors (average speed over all the frequencies of the signal, maximum speed and/or speed of the correction factor or factors associated with one or more particular frequencies) in order to determine the speed of the mechanisms of the degradation of materials and, by extension, the ageing of the electrochemical system BAT.

It is also possible to take interest in the acceleration of the change in these correction factors. For example, a punctual acceleration in the speed of the change of these correction factors can be attributed to a degradation of the materials linked to strong temporary stresses of the electrochemical system BAT (for example operation at high power for a quick charge or discharge, operation at a high temperature or a charge at low temperature, etc.).

Generally, the in-depth analysis of the speed of the change of the correction factors makes it possible to identify the optimal operating conditions of the electrochemical system BAT and those that are to be avoided, in order to objectively define the optimal operating range of the electrochemical system BAT (ranges of the charge state, temperature and maximum power). Note that the optimal operating range of the electrochemical system BAT has no reason to be constant over the entire service life of the electrochemical system BAT: for example certain operating conditions that bring strong stresses can be accepted without much of a problem on new batteries but will no longer be the case on batteries at the end of their life.

Device Implementing the Invention

A fourth aspect of the invention relates to a device comprising means configured to implement a method according to a first, a second or a third aspect of the invention. In an embodiment, the device comprises means PZ1 for generating a calibration signal SC or a probe signal SS within an electrochemical system BAT. In an embodiment, these means for generating can be disposed in a removable manner on the electrochemical system. In an embodiment, the device comprises means PZ2 for receiving the response RE of the electrochemical system to the calibration signal SC or a probe signal SS. In an embodiment, these means for receiving can be disposed in a removable manner on the electrochemical system. In an embodiment, the device comprises a means for calculating and a memory, the memory being configured to store the instructions required for the implementation of a method according to a first, a second or a third aspect of the invention. Moreover, the means for calculating is configured to access this memory and execute the instructions. The means for calculating is configured to control the means PZ1 for generating the probe signal SS or for calibrating the calibration signal SC and for receiving the data collected by the means for receiving PZ2 the response RE of the electrochemical system BAT. In an embodiment, the device is a management system of an electrochemical system BAT, for example a system for managing a battery.

The invention claimed is:

1. A method for detecting a fault of an electrochemical system, said method comprising:
   at a first instant:
      transmitting a first signal, which is a calibration signal, comprising a wave train of multiple frequencies, a spectral density associated with each frequency being identical, in such a way as to induce a response of the electrochemical system;
      receiving the response of the electrochemical system to the calibration signal;
      determining, on the basis of the received response and for each frequency of the calibration signal, a signal attenuation factor;
      determining, for each attenuation factor, a correction factor according to said attenuation factor so as to associate a correction factor with each frequency of the calibration signal;
      determining a probe signal, said probe signal being obtained by multiplying the spectral density associated with each frequency of the calibration signal by the correction factor corresponding to the frequency;
      transmitting the probe signal determined hereinabove to the electrochemical system;
      receiving a response of the electrochemical system to said probe signal; and
      analysing the response to the probe signal in such a way as to detect a fault of the electrochemical system; and
   at a second instant:
      determining a new probe signal by implementing again transmitting the calibration signal, receiving of a response of the electrochemical system to the calibration signal, determining for each frequency of the calibration signal a signal attenuation factor, determining for each attenuation factor a correction factor, and determining the probe signal, the correction factors being memorised; and
      analysing a change in the correction factors in such a way as to detect a fault or an indicator of ageing of the electrochemical system, based on a difference between the correction factors determined at the first instant and the correction factors determined at the second instant.

2. The method according to claim 1, wherein, during the determining a probe signal, the probe signal is determined while the electrochemical system is in a reference state.

3. The method according to claim 2, wherein the transmitting the probe signal, the receiving the response of the electrochemical system and the analysing the response are implemented each time that the electrochemical system is in the reference state used for determining the probe signal.

4. The method according to claim 1, wherein analysing the response comprises:
   a sub-step of determining the spectral density of the response to the probe signal;
   a sub-step of memorising the spectral density of the response to the probe signal;
   a sub-step of comparing the determined spectral density with a statistic of responses, said statistic of responses being determined from spectral densities memorised during preceding implementations of the sub-step of memorising the spectral density of the response to the probe signal; and
   a sub-step of detecting a fault of the electrochemical system when a difference between the spectral density determined during the sub-step of determining and the statistic of the responses is greater than a predetermined value.

5. The method according to claim 1, wherein the spectral density associated with each frequency in the calibration signal is chosen in such a way as to induce a linear response of the electrochemical system.

6. The method according to claim 1, wherein a duration of the probe signal is sufficiently long to establish a stationary regime in the response of the electrochemical system to the probe signal.

7. The method according to claim 1, wherein frequencies associated with an attenuation factor, which is greater than a predetermined threshold, are not taken into account in the determining of the probe signal.

8. The method according to claim 1, wherein the calibration signal is transmitted while the electrochemical system is in a reference state.

9. A method for checking a conformity of an electrochemical system to be checked with respect to a reference electrochemical system comprising:
   determining a probe signal using a method according to claim 1 implemented on the reference electrochemical system;
   for each calibration electrochemical system of a plurality of calibration electrochemical systems:
      transmitting the probe signal determined hereinabove to the calibration electrochemical system;
      receiving a response of the calibration electrochemical system to said probe signal; and
      calculating statistics regarding responses of the calibration electrochemical systems being thus obtained;
   the method also comprising:
      transmitting the probe signal to an electrochemical system to be checked;

receiving a response of the electrochemical system to be checked after the probe signal is transmitted; and comparing the response of the electrochemical system to be checked with the statistic of responses of the calibration electrochemical systems in such a way as to detect a fault of the electrochemical system to be checked.

10. The method according to claim 9, wherein the probe signal is redetermined at a regular interval or on demand from a user.

11. A device for determining a probe signal, for checking a conformity of an electrochemical system or for detecting a fault of an electrochemical system, comprising a computer configured to implement a method according to claim 1.

12. A non-transitory computer-readable storage medium on which is recorded a computer program comprising machine executable instructions to implement the method according to claim 1.

\* \* \* \* \*